United States Patent
Wang (10) Patent No.: US 11,444,642 B2
(45) Date of Patent: Sep. 13, 2022

(54) MOBILE TERMINAL FOR EXPANDING BANDWIDTH OF LTE B41 FREQUENCY BAND, AND METHOD THEREOF

(71) Applicant: TCL Communications (Ningbo) Co., Ltd., Ningbo (CN)

(72) Inventor: Wen Wang, Ningbo (CN)

(73) Assignee: TCL Commanication (Ningbo) Co., Ltd., Ningbo (CN)

(*) Notice: Subject to any disclaimer, the term of this patent is extended or adjusted under 35 U.S.C. 154(b) by 318 days.

(21) Appl. No.: 16/617,003

(22) PCT Filed: May 25, 2018

(86) PCT No.: PCT/CN2018/088485
§ 371 (c)(1),
(2) Date: Nov. 26, 2019

(87) PCT Pub. No.: WO2018/219231
PCT Pub. Date: Dec. 6, 2018

(65) Prior Publication Data
US 2021/0152193 A1 May 20, 2021

(30) Foreign Application Priority Data
May 27, 2017 (CN) .......................... 201710392868.4

(51) Int. Cl.
*H04L 12/00* (2006.01)
*H04B 1/00* (2006.01)
(Continued)

(52) U.S. Cl.
CPC ......... *H04B 1/0057* (2013.01); *H03H 9/6406* (2013.01); *H03H 9/76* (2013.01); *H04B 1/006* (2013.01); *H04L 5/14* (2013.01)

(58) Field of Classification Search
None
See application file for complete search history.

(56) References Cited

U.S. PATENT DOCUMENTS 8,977,226 B2 3/2015 Kim
2011/0261727 A1 10/2011 Han
(Continued)

FOREIGN PATENT DOCUMENTS

CN 101309087 9/2013
CN 101557236 12/2014
(Continued)

OTHER PUBLICATIONS

International Search Report and the Written Opinion dated Aug. 13, 2018 From the International Searching Authority Re. Application No. PCT/CN2018/088485 and Its Translation of Search Report Into English. (9 Pages).

*Primary Examiner* — Noel R Beharry
*Assistant Examiner* — Lionel Preval (57) ABSTRACT

A mobile terminal and a method for expanding a bandwidth of a B41 frequency band in LTE are disclosed. The mobile includes a multimode multiband power amplifier, a duplexer, a first surface acoustic wave (SAW) filter, a selection module, and a radio frequency transmission module. When the multimode multiband power amplifier identifies that the initial signal is a signal in the B41 frequency band, the multimode multiband power amplifier determines a frequency band range of the signal in the B41 frequency band and outputs a transmitting signal in the B41 frequency band.

20 Claims, 3 Drawing Sheets

(51) Int. Cl.
    *H03H 9/64*     (2006.01)
    *H03H 9/76*     (2006.01)
    *H04L 5/14*     (2006.01)

(56) References Cited

U.S. PATENT DOCUMENTS

| | | | |
|---|---|---|---|
| 2014/0307592 A1* | 10/2014 | Khlat | H04B 1/1027 370/278 |
| 2014/0321339 A1 | 10/2014 | Pehlke | |
| 2015/0043620 A1 | 2/2015 | Bai et al. | |
| 2016/0006556 A1* | 1/2016 | Pehlke | H04B 1/0057 370/280 |
| 2018/0152945 A1* | 5/2018 | Balteanu | H04L 5/001 |

FOREIGN PATENT DOCUMENTS

| | | |
|---|---|---|
| CN | 102075209 | 2/2015 |
| CN | 102420686 | 7/2015 |
| CN | 102684864 | 9/2016 |
| CN | 103379670 | 3/2017 |
| CN | 105049077 | 3/2017 |
| CN | 105099484 | 4/2017 |
| CN | 105553505 | 9/2017 |
| CN | 107104685 | 11/2018 |
| WO | PCT WO 2018/219231 | 12/2018 |

* cited by examiner

| When a multimode multiband power amplifier identifies that an initial signal is a signal in the B41 frequency band, a frequency band range of the signal in the B41 frequency band is determined and a corresponding pin is selected to output a transmitting signal in the B41 frequency band. | S100 |

| The transmitting signal belonging to a first frequency band range in the B41 frequency band and outputted from the multimode multiband power amplifier is transmitted to a TXM module via a duplexer and transmitted by the TXM module, the transmitting signal belonging to a second frequency band range in the B41 frequency band and outputted from the multimode multiband power amplifier is transmitted to the TXM module via the first SAW filter and transmitted by the TXM module, and the transmitting signal belonging to a third frequency band range in the B41 frequency band and outputted from the multimode multiband power amplifier is switched to the duplexer by the selection module, transmitted to the TXM module, and transmitted by the TXM module. | S200 |

MOBILE TERMINAL FOR EXPANDING BANDWIDTH OF LTE B41 FREQUENCY BAND, AND METHOD THEREOF

RELATED APPLICATIONS

This application is a National Phase of PCT Patent Application No. PCT/CN2018/088485 having International filing date of May 25, 2018, which claims the benefit of priority of Chinese Patent Application No. 201710392868.4 filed on May 27, 2017. The contents of the above applications are all incorporated by reference as if fully set forth herein in their entirety.

FIELD AND BACKGROUND OF THE INVENTION

The present disclosure relates to a communications technology field, and more particularly to a mobile terminal and a method for expanding a bandwidth of a B41 frequency band in LTE.

BACKGROUND

In the current circuit design of mobile phones, a surface acoustic wave (SAW) filter having a bandwidth of 100 MHz (2555 MHz-2556 MHz) is used for a B41 frequency band in the domestic area and has a size of 1109. In some overseas area, a filter which supports a full frequency band of 194 MHz (2496 MHz-2690 MHz) is required. Accordingly, it is necessary to dispose a bulk acoustic wave (BAW) filter or a film bulk acoustic resonator (FBAR) filter having a size of 2106. However, the size of the common SAW filter is smaller than the size of the BAW filter or the FBAR filter, and the cost of the common SAW filter is cheaper than the cost of the BAW filter or the FBAR filter.

Figure 1:
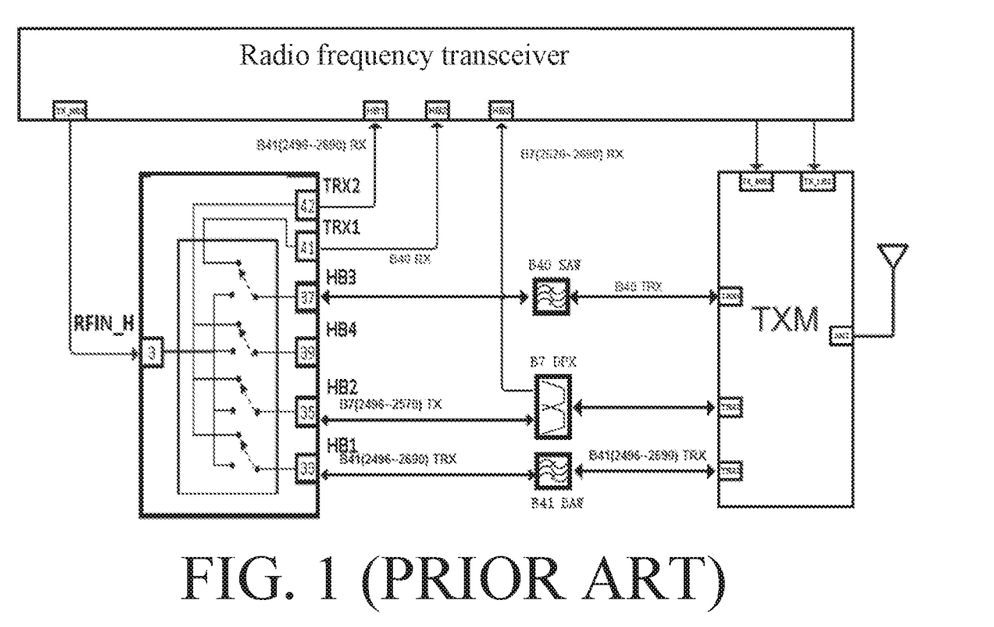
FIG. 1 illustrates a conventional circuit diagram supporting a full frequency band.

FIG. 1 illustrates a conventional circuit diagram supporting a full frequency band. When a signal is transmitted, a thirty-seventh pin of a multimode multiband power amplifier (PA) is configured to transmit a signal in a B40 frequency band. The signal is outputted to a TXM module (i.e., a radio frequency transmission module) via a B40 SAW filter and then transmitted by the TXM module. A thirty-fifth pin of the multimode multiband power amplifier is configured to transmit a signal in a B7 frequency band (a bandwidth is 2496 MHz-2570 MHz). The signal is outputted to the TXM module via a duplexer (DPX) in a B7 frequency band and then transmitted by the TXM module. A thirty-third pin of the multimode multiband power amplifier is configured to transmit a signal in the B41 frequency band (a bandwidth is 2496 MHz-2690 MHz). The signal is outputted to the TXM module via a BAW filter in the B41 frequency band supporting a full frequency band of 194 MHz and then transmitted by the TXM module.

When a signal is received, a signal in the B40 frequency band received by the TXM module is transmitted to the thirty-seventh pin of the multimode multiband power amplifier via the SAW filter, outputted from a forty-first pin of the multimode multiband power amplifier after a switch in the multimode multiband power amplifier selects, and transmitted to a pin HB2 of a radio frequency transceiver. A signal in the B7 frequency band received by the TXM module is transmitted to the duplexer in the B7 frequency band. A signal in an uplink frequency band (2496 MHz-2570 MHz) is transmitted to the thirty-fifth pin of the multimode multiband power amplifier, outputted from a forty-second pin after a switch in the multimode multiband power amplifier selects, and transmitted to a pin HB3 of the radio frequency transceiver. A signal in a downlink frequency band (2620 MHz-2690 MHz) is directly inputted to the pin HB3 of the radio frequency transceiver. A signal in the B41 frequency band received by the TXM module is transmitted to the thirty-third pin of the multimode multiband power amplifier via the BAW filter in the B41 frequency band, outputted from the forty-second pin after a switch in the multimode multiband power amplifier selects, and transmitted to the pin HB3 of the radio frequency transceiver.

In the circuit, the cost of the BAW filter in the B41 frequency band supporting the full frequency band of 194 MHz is high, and thus the cost of a mobile terminal implementing the cover of the full frequency band in the overseas area is increased. Furthermore, it is not convenient to solder circuits because the size of the BAW filter in the B41 frequency band is not compatible with the size of the common SAW filter (having a bandwidth of 100 MHz ranged from 2555 MHz-2655 MHz and a size of 1109) in the B41 frequency band in the domestic area.

SUMMARY OF THE INVENTION

The present disclosure provides a mobile terminal and a method for expanding a bandwidth of a B41 frequency band in LTE aiming to solving the problem that the cost is high when a conventional mobile terminal implements the cover of a full frequency band.

In a first aspect, a mobile terminal for expanding a bandwidth of a B41 frequency band in LTE includes a radio frequency transceiver, a multimode multiband power amplifier, a duplexer, a first SAW filter, a selection module, and a TXM module, wherein the radio frequency transceiver is configured to output an initial signal which requires being transmitted, and the multimode multiband power amplifier is configured to amplify a power of the initial signal and identify a type of the initial signal;

when the multimode multiband power amplifier identifies that the initial signal is a signal in the B41 frequency band, a frequency band range of the signal in the B41 frequency band is determined and a corresponding pin is selected to output a transmitting signal in the B41 frequency band;

the transmitting signal belonging to a first frequency band range in the B41 frequency band and outputted from the multimode multiband power amplifier is transmitted to the TXM module via the duplexer and transmitted by the TXM module, the transmitting signal belonging to a second frequency band range in the B41 frequency band and outputted from the multimode multiband power amplifier is transmitted to the TXM module via the duplexer and transmitted by the TXM module, and the transmitting signal belonging to a third frequency band range in the B41 frequency band and outputted from the multimode multiband power amplifier is transmitted to the TXM module via the duplexer and transmitted by the TXM module.

In the mobile terminal for expanding the bandwidth of the B41 frequency band in LTE, when the multimode multiband power amplifier identifies that the initial signal is a signal in a B7 frequency band, a transmitting signal in the B7 frequency band is outputted, transmitted to the TXM module via the duplexer, and transmitted by the TXM module.

In a second aspect, a mobile terminal for expanding a bandwidth of a B41 frequency band in LTE includes a multimode multiband power amplifier, a TXM module, a selection module, a first SAW filter, and a duplexer, wherein when the multimode multiband power amplifier identifies that an initial signal is a signal in the B41 frequency band, the multimode multiband power amplifier determines a frequency band range of the signal in the B41 frequency band and selects a corresponding pin thereof to output a transmitting signal in the B41 frequency band; the transmitting signal belonging to a first frequency band range in the B41 frequency band and outputted from the multimode multiband power amplifier is transmitted to the TXM module via the duplexer used for a B7 frequency band and transmitted by the TXM module, the transmitting signal belonging to a second frequency band range in the B41 frequency band and outputted from the multimode multiband power amplifier is transmitted to the TXM module via the duplexer and transmitted by the TXM module, and the transmitting signal belonging to a third frequency band range in the B41 frequency band and outputted from the multimode multiband power amplifier is transmitted to the TXM module via the duplexer and transmitted by the TXM module.

In the mobile terminal for expanding the bandwidth of the B41 frequency band in LTE, when the multimode multiband power amplifier identifies that the initial signal is a signal in a B7 frequency band, a transmitting signal in the B7 frequency band is outputted, transmitted to the TXM module via the duplexer, and transmitted by the TXM module.

In the mobile terminal for expanding the bandwidth of the B41 frequency band in LTE, when the TXM module identifies that a received signal is a signal in the B41 frequency band, the TXM module determines a frequency band range of the received signal in the B41 frequency band and selects a corresponding pin thereof to output the received signal in the B41 frequency band;

the duplexer transmits the received signal in the B41 frequency band belonging to the first frequency band range to the multimode multiband power amplifier, the duplexer transmits the received signal in the B41 frequency band belonging to the third frequency band range to the selection module, and the selection module switches the received signal in the B41 frequency band belonging to the third frequency band range to the multimode multiband power amplifier;

the first SAW filter filters the received signal belonging to the second frequency band range and transmits the same to the multimode multiband power amplifier;

the multimode multiband power amplifier transmits, via a channel switching, the received signal in the B41 frequency band to the radio frequency transceiver.

In the mobile terminal for expanding the bandwidth of the B41 frequency band in LTE, when the TXM module identifies that the received signal is a signal in the B7 frequency band, the TXM module selects a corresponding pin to output the received signal in the B7 frequency band;

the duplexer further divides the received signal in the B7 frequency band into an uplink received signal in the B7 frequency band and a downlink received signal in the B7 frequency band and transmits the uplink received signal in the B7 frequency band to the multimode multiband power amplifier, and the selection module switches the downlink received signal in the B7 frequency band to the radio frequency transceiver;

the multimode multiband power amplifier further transmits, via a channel switching, the received signal in the B7 frequency band to the radio frequency transceiver.

In the mobile terminal for expanding the bandwidth of the B41 frequency band in LTE, the selection module is a single pole double throw switch, a connection terminal of the single pole double throw switch is connected to a first interface of the duplexer, a first transmission terminal of the single pole double throw switch is connected to a pin HB3 of the radio frequency transceiver, and a second transmission terminal of the single pole double throw switch is connected to a thirty-ninth pin of the multimode multiband power amplifier; a second interface of the duplexer is connected to a thirty-fifth pin of the multimode multiband power amplifier, and a third interface of the duplexer is connected to a pin TRX2 of the TXM module; one terminal of the first SAW filter is connected to a thirty-third pin of the multimode multiband power amplifier, and the other terminal of a second SAW filter is connected to a pin TRX3 of the TXM module; a forty-second pin of the multimode multiband power amplifier is connected to a pin HB1 of the radio frequency transceiver.

In the mobile terminal for expanding the bandwidth of the B41 frequency band in LTE, the first SAW filter is a SAW filter used for the B41 frequency band and having a size of 1109, and a frequency band range is 2555 MHz-2655 MHz.

In the mobile terminal for expanding the bandwidth of the B41 frequency band in LTE, the first frequency band range is 2496 MHz-2570 MHz, the second frequency band range is 2555 MHz-2655 MHz, and the third frequency band range is 2620 MHz-2690 MHz.

The mobile terminal for expanding the bandwidth of the B41 frequency band in LTE further includes a second SAW filter, wherein one terminal of the second SAW filter is connected to a thirty-seventh pin of the multimode multiband power amplifier, the other terminal of the second SAW filter is connected to a pin TRX1 of the TXM module, and a forty-first pin of the multimode multiband power amplifier is connected to a pin HB2 of the radio frequency transceiver;

the multimode multiband power amplifier is further configured to output a transmitting signal in a B40 frequency band, and the transmitting signal in the B40 frequency band is transmitted to the TXM module and then transmitted after the second SAW filter filters the transmitting signal in the B40 frequency band;

the TXM module is further configured to output, according to a frequency band of a received signal, a received signal in the B40 frequency band, the received signal in the B40 frequency band is transmitted to the multimode multiband power amplifier after the second SAW filter filters the received signal in the B40 frequency band, and the received signal in the B40 frequency band is outputted from the forty-first pin of the multimode multiband power amplifier via a channel switching and inputted to the pin HB2 of the radio frequency transceiver.

In a third aspect, a method for expanding a bandwidth of a B41 frequency band in LTE includes:

when a multimode multiband power amplifier identifies that an initial signal is a signal in the B41 frequency band, a frequency band range of the signal in the B41 frequency band is determined and a corresponding pin is selected to output a transmitting signal in the B41 frequency band;

outputting the transmitting signal belonging to a first frequency band range in the B41 frequency band and outputted from the multimode multiband power amplifier to a TXM module via a duplexer, and transmitting the transmitting signal by the TXM module; outputting the transmitting signal belonging to a second frequency band range in the B41 frequency band and outputted from the multimode multiband power amplifier to the TXM module via a first SAW filter, and transmitting the transmitting signal by the TXM module; and switching the transmitting signal belonging to a third frequency band range in the B41 frequency band and outputted from the multimode multiband power amplifier to the duplexer, and transmitting the transmitting signal by the TXM module.

The method for expanding the bandwidth of the B41 frequency band in LTE further includes:

when the multimode multiband power amplifier identifies that the initial signal is a signal in a B7 frequency band, a transmitting signal in the B7 frequency band is outputted, transmitted to the TXM module via the duplexer, and transmitted by the TXM module.

In the mobile terminal and the method for expanding the bandwidth of the B41 frequency band in LTE, when the multimode multiband power amplifier identifies that an initial signal is a signal in the B41 frequency band, a frequency band range of the signal in the B41 frequency band is determined and a corresponding pin is selected to output a transmitting signal in the B41 frequency band. The transmitting signal belonging to the first frequency band range in the B41 frequency band and outputted from the multimode multiband power amplifier is transmitted to the TXM module via the duplexer for the B7 frequency band and transmitted by the TXM module. The transmitting signal belonging to the second frequency band range in the B41 frequency band and outputted from the multimode multiband power amplifier is transmitted to the TXM module via the first FAW filter and transmitted by the TXM module. The transmitting signal belonging to the third frequency band range in the B41 frequency band and outputted from the multimode multiband power amplifier is switched to the duplexer by the selection module, transmitted to the TXM module, and transmitted by the TXM module. By the channel switching of the selection module, two of the three frequency band ranges use the duplexer for the B7 frequency band, and one of the three frequency band ranges uses the first SAW filter, thereby implementing the cover of the full frequency band of the B41 frequency band. Furthermore, a cost of the SAW filter is low in comparison with the conventional BAW filters which support the full frequency band of 194 MHz. A cost of the circuit can be decreased significantly. It is not necessary to replace the first SAW filter, and thus the problem that it is not convenient to solder circuits because the BAW filter having the size of 2016 is not compatible with the SAW filter having the size of 1109 in the domestic area the size can be solved.

DESCRIPTION OF SPECIFIC EMBODIMENTS OF THE INVENTION

The present disclosure provides a mobile terminal and a method for expanding a bandwidth of a B41 frequency band in LTE capable of improving a conventional circuit supporting a full frequency band of the B41 frequency band. A bandwidth of a surface acoustic wave (SAW) filter is broaden by adding a single pole double throw switch, thereby implementing the cover of the full frequency band of the B41 frequency band. To make the objectives, technical schemes, and technical effects of the present disclosure more clearly and definitely, the present disclosure will be described in details below by using embodiments in conjunction with the appending drawings. It should be understood that the specific embodiments described herein are merely for explaining the present disclosure but not intended to limit the present disclosure.

Figure 2:
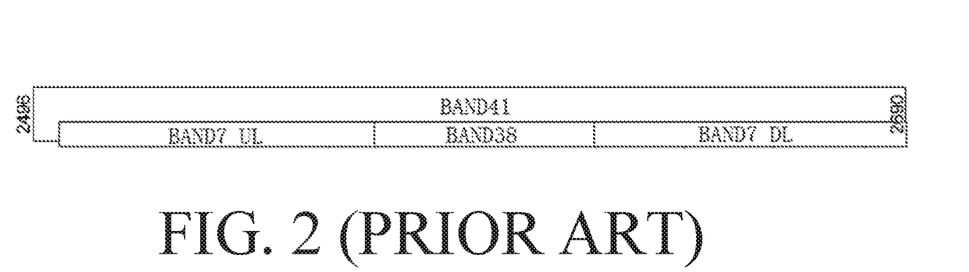
FIG. 2 illustrates a coverage table including a B41 frequency band and a B7 frequency band in a Long Term Evolution.
Figure 3:
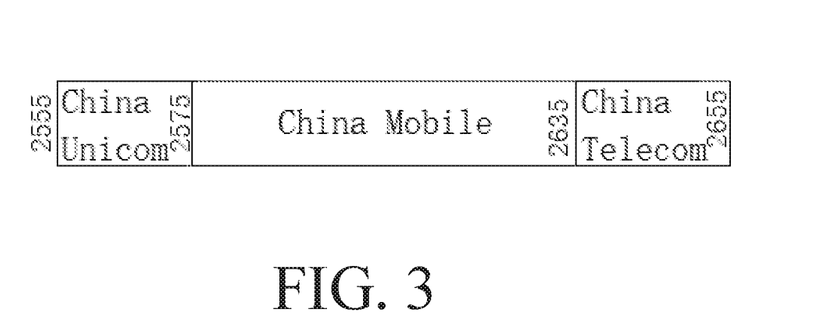
FIG. 3 illustrates frequency band ranges of different operators in the B41 frequency band.

Please refer to FIG. 2. In a coverage table of a frequency band in a Long Term Evolution (LTE, i.e., 3.9 GHz), an uplink frequency band (2500 MHz-2570 MHz) and a downlink frequency band (2620 MHz-2690 MHz) of a B7 frequency band (i.e., Band 7) is included in a frequency band range (2496 MHz-2690 MHz) of a B41 frequency band (i.e., Band 41). The uplink frequency band of a duplexer for the B7 frequency band is usually designed from 2496 MHz to 2570 MHz. The downlink frequency band is usually designed from 2616 MHz to 2690 MHz. As shown in FIG. 3, a frequency band supported by a partial filter for the B41 frequency band in a domestic version is ranged from 2555 MHz to 2655 MHz. A frequency band supported by Chine Unicom is ranged from 2555 MHz to 2575 MHz. A frequency band supported by China Mobile is ranged from 2575 MHz to 2635 MHz. A frequency band supported by China Telecom is ranged from 2635 MHz to 2655 MHz. The frequency band of the partial filter (SAW filter) for the B41 frequency band in the domestic version is ranged between the uplink frequency band the downlink frequency band of the B7 frequency band. Since most mobile phones in the overseas area have duplexers for the B7 frequency band disposed therein, bandwidths of the partial SAW filters for the B41 frequency band can be expanded using the uplink frequency band and the downlink frequency band of the B7 frequency band. As such, the full frequency band of the B41 frequency band can be supported.

Figure 4:
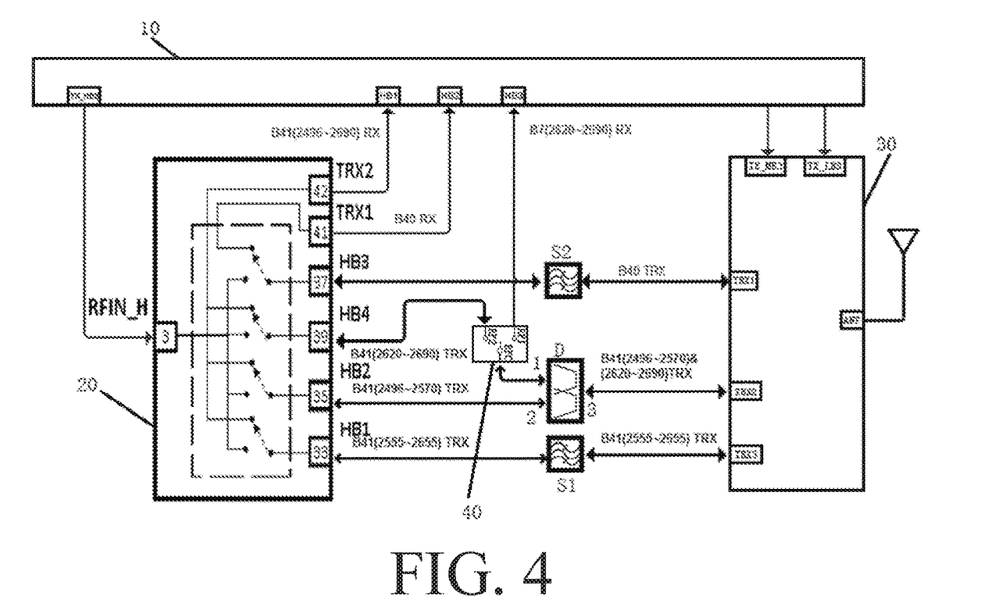
FIG. 4 illustrates a block diagram of a mobile terminal for expanding a bandwidth of a B41 frequency band in LTE in accordance with an embodiment of the present disclosure.

Please refer to FIG. 4. The mobile terminal for expanding the bandwidth of the B41 frequency band in LTE provided by the present disclosure includes a radio frequency transceiver 10, a multimode multiband power amplifier 20, a TXM module 30, a selection module 40, a first SAW filter S1, and a duplexer D. A pin TX_HB2 of the radio frequency transceiver 10 is connected to a third pin of the multimode multiband power amplifier 20. The radio frequency transceiver 10 is configured to output an initial signal RFIN_H (a small signal) which requires being transmitted. The initial signal RFIN_H may be a signal in a B7 frequency band, a signal in a B40 frequency, or a signal in the B41 frequency band. The multimode multiband power amplifier 20 is configured to amplify a power of the initial signal RFIN_H, identify a type of the initial signal RFIN_H, and select a corresponding pin thereof to output the initial signal RFIN_H which is amplified.

When the multimode multiband power amplifier 20 identifies that the initial signal RFIN_H is the signal in the B7 frequency band, a transmitting signal in the B7 frequency band is outputted, transmitted to the TXM module 30 via the duplexer D, and transmitted by the TXM module 30. When the multimode multiband power amplifier 20 identifies that the initial signal RFIN_H is the signal in the B41 frequency band, a frequency band range of the signal in the B41 frequency band is determined and a corresponding pin is selected to output a transmitting signal in the B41 frequency band. The transmitting signal in the B41 frequency band belonging to a first frequency band range (2496 MHz-2570 MHz) is transmitted to the TXM module 30 via the duplexer D and transmitted by the TXM module 30. The transmitting signal in the B41 frequency band belonging to a second frequency band range (2555 MHz-2655 MHz) and outputted by the multimode multiband power amplifier 20 is transmitted to the TXM module 30 via the first SAW filter S1 and transmitted by the TXM module 30. The transmitting signal in the B41 frequency band belonging to a third frequency band range (2620 MHz-2690 MHz) and outputted by the multimode multiband power amplifier 20 is switched by the selection module 40, outputted to the TXM module 30 via the duplexer D, and transmitted by the TXM module 30.

The TXM module 30 is configured to identify a type of a received signal according to a frequency band of the received signal and select a corresponding pin to output the received signal. When the TXM module 30 identifies that the received signal is a signal in the B41 frequency band, a frequency band range of the received signal in the B41 frequency band is determined and a corresponding pin is selected to output the received signal in the B41 frequency band. The duplexer D directly transmits the received signal in the B41 frequency band belonging to the first frequency band range (2496 MHz-2570 MHz) to the multimode multiband power amplifier 20. The duplexer D transmits the received signal in the B41 frequency band belonging to the third frequency band range (2620 MHz-2690 MHz) to the selection module 40. The received in the B41 frequency band belonging to the third frequency band range is switched to the multimode multiband power amplifier 20 by the selection module 40. The received signal belonging to the second frequency band range (2555 MHz-2655 MHz) is transmitted to the multimode multiband power amplifier 20 after being filtered by the first SAW filter S1. The multimode multiband power amplifier 20 transmits, via a channel switching, the received signal in the B7 frequency band or the received signal in one of the three frequency band ranges to the radio frequency transceiver 10.

When the TXM module 30 identifies that the received signal is a signal in the B7 frequency band, a received signal in the B7 frequency band is outputted. The received signal in the B7 frequency band is divided into an uplink received signal (2496 MHz-2570 MHz) in the B7 frequency band and a downlink received signal (2620 MHz-2690 MHz) in the B7 frequency band by the duplexer D. The uplink received signal in the B7 frequency band is directly outputted to the multimode multiband power amplifier 20. The downlink received signal in the B7 frequency band is switched to the radio frequency transceiver 10 by the selection module 40.

It is noted that the radio frequency transceiver 10, the multimode multiband power amplifier 20, the TXM module 30 (including a 2G power amplifier and a switch), the first SAW filter S1, and the duplexer D are conventional elements, and the functions thereof are not described in detail herein. In the present embodiment, receiving/transmitting channels of the signal in the B41 frequency band are changed. The three receiving/transmitting channels are disposed according to the three frequency band ranges of the signal in the B41 frequency band. The channels are switched by the election module 40. The signal in the B41 frequency band is transmitted via a corresponding channel according to the frequency band range in which a practical frequency band of the signal in the B41 frequency band. Two of the three receiving/transmitting channels of the signal in the B41 frequency band are transmitted by receiving/transmitting channels of the signal in the B7 frequency band, and one of the three receiving/transmitting channels via the first SAW filter S1 in the domestic area retains. As such, only the selection module 40 is necessary to be added. Adding the selection module 40 can decrease a circuit cost significantly in comparison with the conventional BAW filters which support the full frequency band of 194 MHz. It is not necessary to replace the first SAW filter S1, and thus the problem that it is not convenient to solder circuits because the BAW filter having the size of 2016 is not compatible with the SAW filter having the size of 1109 in the domestic area can be solved.

In the present embodiment, the selection module 40 is a single pole double throw switch. A connection terminal RFC of the single pole double throw switch is connected to a first interface of the duplexer D. A first transmission terminal RF1 of the single pole double throw switch is connected to a pin HB3 of the radio frequency transceiver 10. A second transmission terminal RF2 of the single pole double throw switch is connected to a thirty-ninth pin of the multimode multiband power amplifier 20. A second interface of the duplexer D is connected to a thirty-fifth pin of the multimode multiband power amplifier 20. A third interface of the duplexer D is connected to a pin TRX2 of the TXM module 30. One terminal of the first SAW filter 51 is connected to a thirty-third pin of the multimode multiband power amplifier 20. The other terminal of the first SAW filter 51 is connected to a pin TRX3 of the TXM module 30. A forty-second pin of the multimode multiband power amplifier 20 is connected to a pin HB1 of the radio frequency transceiver 10. The single pole double throw switch further includes a control terminal (not shown) connected to a baseband processor. The baseband processor is configured to control the connection terminal RFC of the single pole double throw switch to be connected to the first transmission terminal RF1 or the second transmission terminal RF2. When the baseband processor outputs a high voltage level to the control terminal, the connection terminal RFC is controlled to be connected to the second transmission terminal RF2. When the baseband processor outputs a low voltage level to the control terminal, the connection terminal RFC is controlled to be connected to the first transmission terminal RF1.

Please continue to refer to FIG. 4. A signal flow direction consists of a transmitting part and a receiving part. In a specific implementation, a transmitting process of the full frequency band in the B41 frequency band is performed via three paths of the multimode multiband power amplifier 20.

In a first path, a transmitting signal in the first frequency band range (2496 MHz-2570 MHz) in the B41 frequency band is outputted from a pin 35 (also referred to as a second pin (a pin HB2) of a high frequency channel) of the multimode multiband power amplifier 20, inputted to the second interface of the duplexer D, outputted from the third interface of the duplexer for the B7 frequency band, inputted to the pin TRX3 of the TXM module 30, outputted from a pin ANT of the TXM module 30, and transmitted by an antenna of the TXM module 30.

In a second path, a transmitting signal in the second frequency band range (2555 MHz-2655 MHz) in the B41 frequency band is outputted from the pin 33 (also referred to as a first pin (a pin HB1) of the high frequency channel) of the multimode multiband power amplifier 20, inputted to the one terminal of the first SAW filter S1, outputted from the other terminal of the first SAW filter S1, inputted to the pin TRX3 of the TXM module 30, outputted from the pin ANT of the TXM module 30, and transmitted by the antenna of the TXM module 30. The first SAW filter S1 is a conventional and common SAW filter for the B41 frequency band having the size of 1109. That is, this path is a common SAW path in the B41 frequency band (100 MHz), and a frequency band range of this path is 2555 MHz-2655 MHz.

In a third path, a transmitting signal in the third frequency band range (2620 MHz-2690 MHz) in the B41 frequency band is outputted from a pin 39 (also referred to as a fourth pin (a pin HB4) of the high frequency channel) of the multimode multiband power amplifier 20, inputted to the second transmission terminal RF2 of the single pole double throw switch (i.e., SP2T switch), outputted from the connection terminal RFC of the single pole double throw switch, inputted to the first interface of the duplexer D, outputted from the third interface of the duplexer D, inputted to the pin TRX2 of the TXM module 30, outputted from the pin ANT of the TXM module 30, and transmitted by the antenna of the TXM module 30. This path is switched by the single pole double throw switch and passes through a receiving channel of the duplexer D for the B7 frequency band.

In the first path, a transmitting channel of the uplink frequency band in the B7 frequency band is used to expand a part of the bandwidth of the B41 frequency band. In the third path, a transmitting channel of the downlink frequency band in the B7 frequency band is used to expand another part of the bandwidth of the B41 frequency band. The second path is a conventional transmitting channel of the B41 frequency band and is only used to transmit a remaining part of the bandwidth of the B41 frequency band. As such, the circuit design of a conventional mobile phone in the domestic area is not necessary to be changed. It is not necessary to use a BAW filter having a high cost, and thus the cost can be saved.

A receiving process is reverse to the transmitting process. The only difference is that when a received signal is inputted to the thirty-third pin, the thirty-fifth pin, or the thirty-ninth pin of the multimode multiband power amplifier 20, the received signal is outputted from the forty-second pin via one path selected by a single pole four throw switch (i.e., 3P4T switch) in the multimode multiband power amplifier 20 and then inputted to the radio frequency transceiver 10.

The mobile terminal further includes a second SAW filter S2. One terminal of the second SAW filter S2 is connected to a thirty-seventh pin of the multimode multiband power amplifier 20. The other terminal of the second SAW filter S2 is connected to a pin TRX1 of the TXM module 30. A forty-first pin of the multimode multiband power amplifier 20 is connected to the pin HB2 of the radio frequency transceiver 10. When a transmitting signal is transmitted, the multimode multiband power amplifier 20 is further configured to select, according to the frequency band of the initial signal RFIN_H, a corresponding pin to output the transmitting signal in the B40 frequency signal. The transmitting signal in the B40 frequency band is transmitted to the TXM module 30 and then transmitted by the TXM module 30 after the second SAW filter S2 filters the transmitting signal in the B40 frequency band. When a received signal is received, the TXM module 30 is further configured to select, according to the frequency band of the received signal, a corresponding pin to output the received signal in the B40 frequency signal. The received signal in the B40 frequency signal is transmitted to the multimode multiband power amplifier 20 after the second SAW filter S2 filters the received signal in the B40 frequency band. The received signal in the B40 frequency band is outputted from the forty-first pin of the multimode multiband power amplifier 20 via an internal channel and inputted to the pin HB2 of the radio frequency transceiver 10. The receiving and transmitting of the signal in the B41 frequency band do not affect the receiving and transmitting of the signal in the B40 frequency band, thereby ensuring that the full frequency band of the B41 frequency band can be implemented during normal communications of the mobile terminal.

Based on the above-mentioned mobile terminal, the present disclosure further provides a method for expanding a bandwidth of a B41 frequency band in LTE. Please refer to FIG. 5. The method for expanding the bandwidth of the B41 frequency band in LTE includes the following steps.

Figure 5:
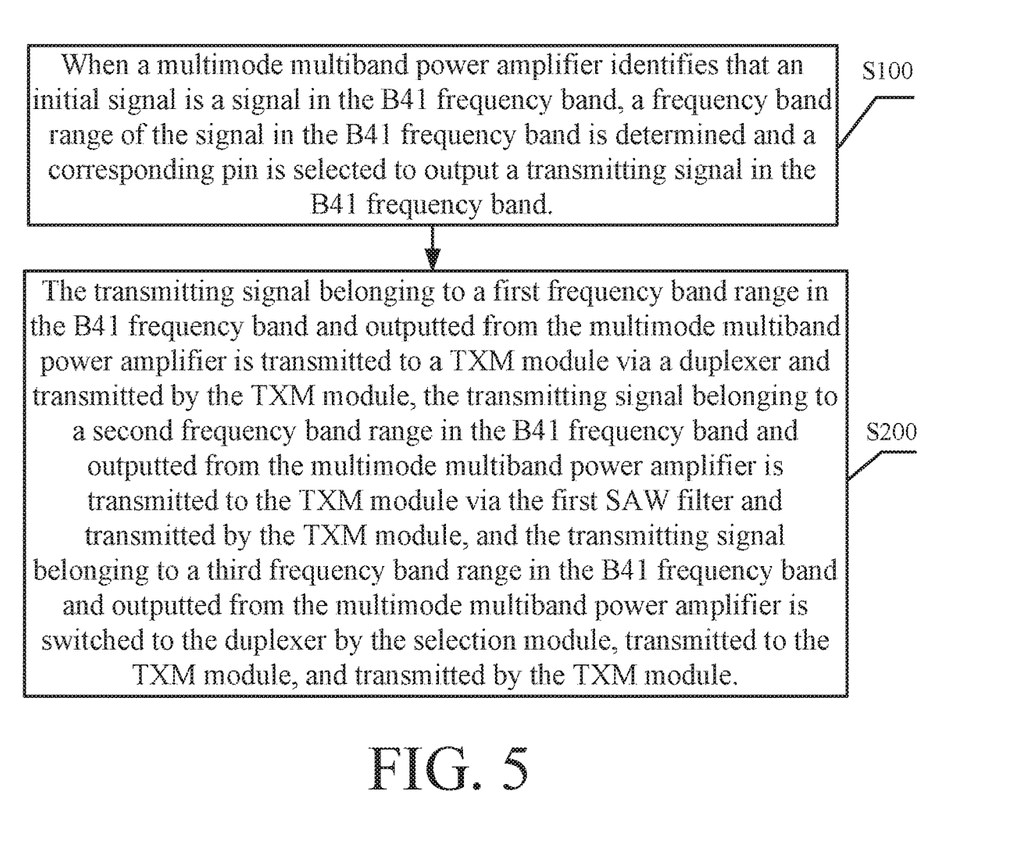
FIG. 5 illustrates a flow chart of a method for expanding a bandwidth of a B41 frequency band in LTE in accordance with an embodiment of the present disclosure.

In step S100, when a multimode multiband power amplifier identifies that an initial signal is a signal in the B41 frequency band, a frequency band range of the signal in the B41 frequency band is determined and a corresponding pin is selected to output a transmitting signal in the B41 frequency band.

In step S200, the transmitting signal belonging to a first frequency band range in the B41 frequency band and outputted from the multimode multiband power amplifier is transmitted to a TXM module via a duplexer and transmitted by the TXM module, the transmitting signal belonging to a second frequency band range in the B41 frequency band and outputted from the multimode multiband power amplifier is transmitted to the TXM module via the first SAW filter and transmitted by the TXM module, and the transmitting signal belonging to a third frequency band range in the B41 frequency band and outputted from the multimode multiband power amplifier is switched to the duplexer by the selection module, transmitted to the TXM module, and transmitted by the TXM module.

The signal in the B41 frequency signal is received and transmitted via one of the three frequency band ranges. Two of the three frequency band ranges use the duplexer for a B7 frequency band, and one of the three frequency band ranges uses a first SAW filter, thereby implementing the cover of the full frequency band of the B41 frequency band. Furthermore, a SAW filter having a size of 1109 and a low cost can serve as the first SAW filter. A cost of the circuit can be decreased significantly in comparison with the conventional BAW filters which support the full frequency band of 194 MHz.

In a further implementation, the method for expanding the bandwidth of the B41 frequency band in LTE further includes the following steps. When the multimode multiband power amplifier identifies that the initial signal is a signal in the B7 frequency band, a transmitting signal in the B7 frequency band is outputted, transmitted to the TXM module via the duplexer, and transmitted by the TXM module. The signal in one of the two of the three frequency band ranges and the signal in the B7 frequency band share the duplexer. The two signals do not conflict due to the channel switching of a selection module, and the normal receiving/transmitting of the signal in the B7 frequency band can be ensured.

In a further implementation, the method for expanding the bandwidth of the B41 frequency band in LTE further includes the following steps. When the TXM module identifies that a received signal is a signal in the B41 frequency band, a frequency band range of the signal in the B41 frequency band is determined. The duplexer transmits the received signal belonging to the first frequency band range in the B41 frequency band to the multimode multiband power amplifier. The duplexer transmits the received signal belonging to the third frequency band range in the B41 frequency band to the selection module. The received signal is switched to the multimode multiband power amplifier by the selection module. The received signal belonging to the second frequency band range in the B41 frequency band is transmitted to the multimode multiband power amplifier after being filtered by the first SAW filter. The received signal is also transmitted via a corresponding one of the three frequency band ranges in the B41 frequency band, thereby implementing the receiving of the cover of the full frequency band of the B41 frequency band.

In summary, in the present disclosure, three receiving/transmitting channels are disposed according to the three frequency band ranges in the B41 frequency band. The channels are switched by the single pole double throw switch. The signal in the two of the three frequency band ranges is transmitted by the duplexer for the B7 frequency band, and the signal in one of the three frequency band ranges is transmitted by the first SAW filter, thereby implementing the cover of the full frequency band of the B41 frequency band. Since the cost of the first SAW filter is low in comparison with the conventional BAW filters which support the full frequency band of 194 MHz, the cover of the full frequency band can be implemented in a lowest cost and the bandwidth can be increased. It is not necessary to replace the first SAW filter, and thus the problem that it is not convenient to solder circuits because the BAW filter having the size of 2016 is not compatible with the SAW filter having the size of 1109 in the domestic area the size can be solved.

It should be noted that those skilled in the art may understand all or some of the processes in the methods of the embodiments described above can be realized by using programs to instruct corresponding hardware (e.g., a processor, a controller and so on). The programs may be stored in a computer readable storage medium. The storage medium may include read-only memory (ROM), random access memory (RAM), disk, compact disc (CD), or the like.

Figure 6:
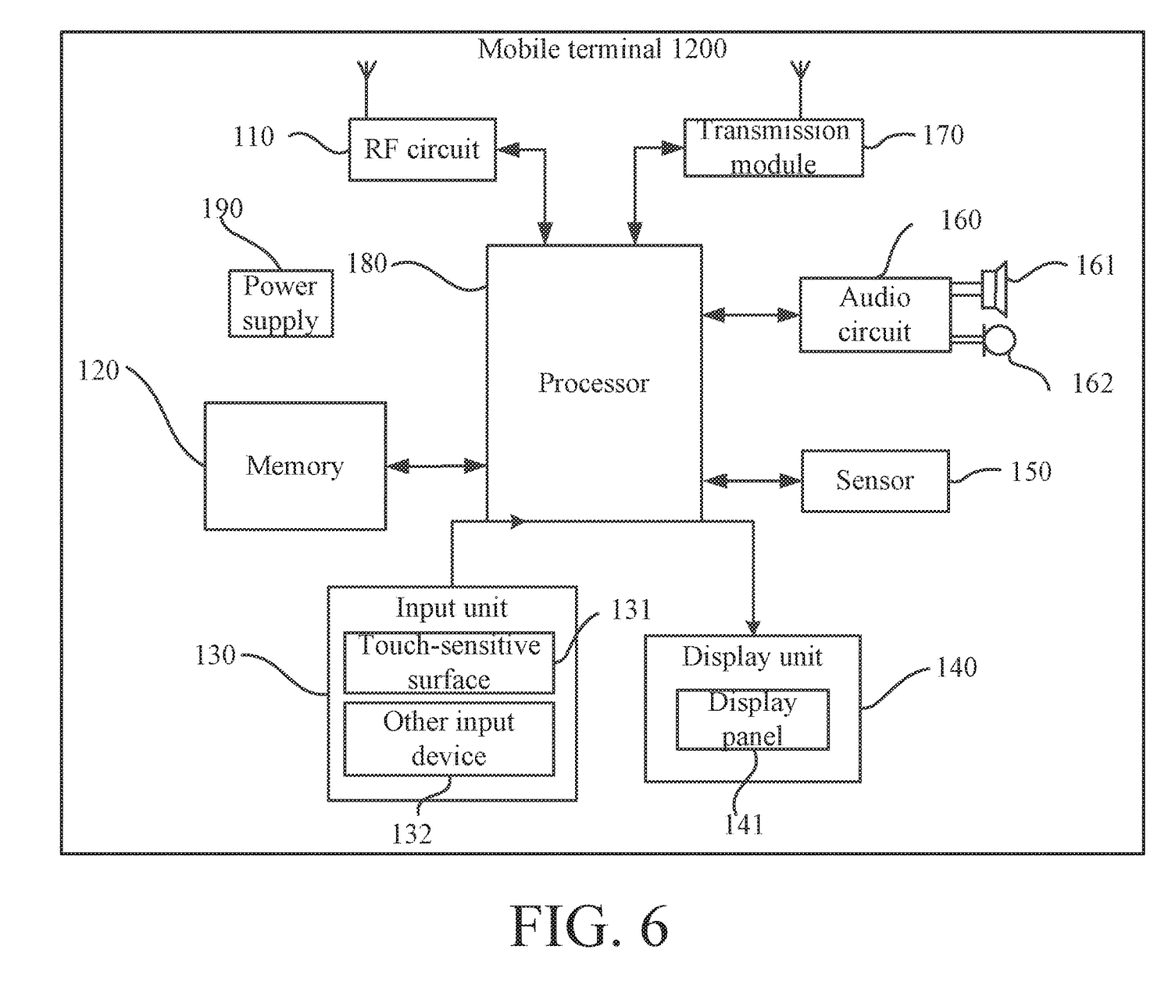
FIG. 6 illustrates a block diagram of a mobile terminal in accordance with an embodiment of the present disclosure.

FIG. 6 illustrates a block diagram of a mobile terminal in accordance with an embodiment of the present disclosure. The mobile terminal may be used to implement the mobile terminal and method for expanding the bandwidth of the B41 frequency band in LTE provided by the above-mentioned embodiments of the present disclosure. The mobile terminal 1200 may be a smart phone or a tablet computer.

As shown in FIG. 6, the mobile terminal 1200 may include a radio frequency (RF) circuit 110, a memory 120 including one or more computer readable storage mediums (only one is shown in FIG. 6), an input unit 130, a display unit 140, at least one sensor 150, an audio circuit 160, a transmission module 170, a processor 180 including one or more processing cores (only one is shown in FIG. 6), a power supply 190 and the like. Those skilled in the art can understand that the mobile terminal 1200 is not limited to the structure shown in FIG. 6, and may include more or fewer parts than those shown in FIG. 6, or some parts may be combined, or different arrangement of parts may be adopted.

The RF circuit 110 is configured to receive and transmit electromagnetic waves and to realize conversions of the electromagnetic waves and electrical signals, thereby communicating with a communication network or any other device. The RF circuit may include various conventional circuit elements used for performing these functions, for example, an antenna, a radio frequency transmitter, a digital signal processor, an encryption/decryption chip, a subscriber identification module (SIM) card, a memory and the like. The RF circuit 1010 may communicate with various networks, for example, an internet, an intranet or a wireless network, or may communicate with any other device via a wireless network. The above-mentioned wireless network may include a cellular telephone network, a wireless local area network or a metropolitan area network. The above-mentioned wireless network may use various communication standards, protocols and technologies and may include but not limited to, Global System of Mobile Communication (GSM), Enhanced Data GSM Environment (EDGE), Wideband Code Division Multiple Access (WCDMA), Code Division Multiple Access (CDMA), Time Division Multiple Access (TDMA), Wireless Fidelity (Wi-Fi, for example, Institute of Electrical and Electronics Engineers (IEEE) 802.11a, IEEE 802.11b, IEEE 802.11g and/or IEEE 802.11n), Voice over Internet Protocol (VoIP) Worldwide Interoperability for Microwave Access (Wi-Max), other protocols for E-mail, instant messaging and Short Messaging Service (SMS) and other suitable communication protocols, and may include protocols which are not developed currently.

The memory 120 may be configured to store software programs and software modules, for example, the program instructions/modules corresponding to the method and system for automatically determining the focus of the dynamic photo based on the mobile terminal in accordance with the above-mentioned embodiments. The processor 180 executes various functional applications and data processing by operating the software programs and the software modules stored in the memory 120, so as to implement the functions of the method and system for automatically determining the focus of the dynamic photo based on the mobile terminal. The memory 120 may include a high speed random access memory and also may include a non-volatile memory, such as one or more disk storage devices, a flash memory device or other non-volatile solid storage devices. In some embodiments, the memory 120 may further include a remote memory disposed corresponding to the processor 180. The remote memory may be connected to the mobile terminal 1200 via a network. Examples of the network include but are not limited to an internet, an intranet, a local area network, a mobile communication network and the combinations of them.

The input unit 130 may be configured to receive input number or character information and to generate keyboard, mouse, joystick, optical or trajectory ball signal inputs related to a user's setting and functional control. In detail, the input unit 130 may include a touch-sensitive surface 131 and other input device 132. The touch-sensitive surface 131, also called a touch display screen or a touch panel, may be configured to detect touch operations of a user on or near the touch-sensitive surface 131 (for example, operations carried out by the user through any suitable objects or attachments, such as a finger, a touch pen and the like, on the touch-sensitive surface 131 or near the touch control panel 1031) and to drive a corresponding device connected therewith according to a preset program. Optionally, the touch-sensitive surface 131 may include a touch detection device and a touch controller. The touch detection device detects the touch direction of the user, detects a signal caused by the touch operation and transmits the signal to the touch controller. The touch controller receives touch information from the touch detection device, converts the touch information into a contact coordinate and then transmits the contact coordinate to the processor 180 and may receive a command transmitted by the processor 180 and execute the command. Moreover, the touch-sensitive surface 131 may be one of various types, such as a resistance type, a capacitance type, an infrared type, a surface acoustic wave type and the like. Besides the touch-sensitive surface 131, the input unit 130 also may include other input device 132. In detail, other input device 132 may include, but is not limited to, one or more of a physical keyboard, function keys (such as a volume control key, a switching key and the like), a trackball, a mouse, a joystick and the like.

The display unit 140 may be configured to display information input by the user or information provided for the user and various graphical user interfaces of the mobile terminal 1200. The graphical user interfaces may be constituted by graphics, texts, icons, videos and any combinations of them. The display unit 140 may include a display panel 141. Optionally, the display panel 141 may be configured in forms of a Liquid Crystal Display (LCD), an Organic Light-Emitting Diode (OLED) and the like. Furthermore, the touch panel 131 may cover the display panel 141. When the touch-sensitive surface 131 detects a touch operation on or near it, the signal caused by the touch operation is transmitted to the processor 180 to determine the type of a touch event. Then, the processor 180 provides a corresponding visual output on the display panel 141 according to the type of the touch event. In FIG. 4, the touch-sensitive surface and the display panel 141 are served as two independent parts for accomplishing input and output functions, however, in some embodiments, the touch-sensitive surface 131 and the display panel 1041 may be integrated to accomplish the input and output functions.

The mobile terminal 1200 may further include at least one sensor 150, such as a gyroscope sensor, a magnetic induction sensor, an optical sensor, a motion sensor and other sensors. In detail, the optical sensor may include an environmental light sensor and a proximity sensor. The environmental light sensor may adjust brightness of the display panel 141 according to the lightness of environmental light. The proximity sensor may turn off the display panel 141 and/or backlight when the mobile terminal 1200 approaches an ear. As one type of the motion sensor, an accelerometer sensor may detect the value of an acceleration in each direction (generally in three axial directions), may detect the value and the direction of gravity in a static state, which may be used in posture identifying functions (such as switching between a horizontal screen and a vertical screen, switching related to a game, and calibration on the posture of a magnetometer), vibration identifying functions (such as for pedometer and striking) and the like. Furthermore, a gyroscope, a barometer, a humidity meter, a thermometer, an infrared sensor and other sensors may be integrated into the mobile terminal 1200, and explanations are not repeated herein.

The audio circuit 160, a speaker 161 and a microphone 162 may provide an audio interface between the user and the mobile terminal 1200. The audio circuit 160 may transmit an electric signal obtained by converting received audio data to the speaker 161. The electric signal is converted into a sound signal to be outputted by the speaker 161. On the other hand, the microphone 1062 converts a collected sound signal into an electric signal. The audio circuit 1060 receives the electric signal and converts the electric signal into audio data. After the audio data is outputted to the processor 180 and is processed, it is transmitted, for example, to another terminal through the RF circuit 110, or is outputted to the memory 120 in order to be further processed. The audio circuit 160 may further include an ear plug hole for providing communication between an external ear phone and the mobile terminal 1200.

The mobile terminal 1200 can help the user to receive and send E-mails, browse webpages, access streaming media and the like by the transmission module 170 (for example, a Wi-Fi module). The transmission module 170 provides wireless broadband internet access for the user. Although the transmission module 170 is shown in FIG. 4, it should be understood that the transmission module 170 is not the necessary part of the mobile terminal 1200 and may completely be omitted as required without changing the scope of the present disclosure.

The processor 180 is a control center of the mobile terminal 1200, is connected with all the parts of the whole mobile phone by various interfaces and lines and is configured to execute various functions of the mobile terminal 1200 and process the data by operating the software programs and/or the modules stored in the memory 120, and to call the data stored in the memory 120 so as to carry out integral monitoring on the mobile phone. Optionally, the processor 180 may include one or more processing cores. In some embodiments, the processor 180 may be integrated with an application processor and a modulation/demodulation processor. The application processor is mainly configured to process an operating system, at least one user interface, at least one application and the like. The modulation/demodulation processor is mainly configured to process wireless communication. It should be understood that the modulation/demodulation processor may also be not integrated into the processor 180.

The mobile terminal 1200 further includes the power supply 190 (such as a battery) for supplying power to each part. In some embodiments, the power supply may be logically connected with the processor 180 by a power supply management system, so as to implement functions of charge management, discharge management, power consumption management and the like by the power supply management system. The power supply 190 may further include one or more direct current or alternating current power supplies, recharging systems, power supply failure detection circuits, power converters or inverters, power supply status indicators and the like.

Although not shown in the FIG. 6, the mobile terminal 1200 may further include a camera (for example, a front camera or a rear camera), a BLUETOOTH module, and the like which are not further described herein.

The present embodiment of the present disclosure further provides a mobile terminal for expanding a bandwidth of a B41 frequency band in LTE. The mobile terminal includes a radio frequency transceiver, a multimode multiband power amplifier, a duplexer, a first SAW filter, a selection module, and a TXM module. The radio frequency transceiver is configured to output an initial signal which requires being transmitted. The multimode multiband power amplifier is configured to amplify a power of the initial signal and identify a type of the initial signal.

When the multimode multiband power amplifier identifies that the initial signal is a signal in the B41 frequency band, a frequency band range of the signal in the B41 frequency band is determined and a corresponding pin is selected to output a transmitting signal in the B41 frequency band.

The transmitting signal belonging to a first frequency band range in the B41 frequency band and outputted from the multimode multiband power amplifier is transmitted to the TXM module via the duplexer and transmitted by the TXM module. The transmitting signal belonging to a second frequency band range in the B41 frequency band and outputted from the multimode multiband power amplifier is transmitted to the TXM module and transmitted by the TXM module after being filtered by the first SAW filter. The transmitting signal belonging to a third frequency band range in the B41 frequency band and outputted from the multimode multiband power amplifier is switched to the duplexer by the selection module, transmitted to the TXM module via the duplexer, and transmitted by the TXM module.

In the mobile terminal for expanding the bandwidth of the B41 frequency band in LTE, when the multimode multiband power amplifier identifies that the initial signal is a signal in a B7 frequency band, a transmitting signal in the B7 frequency band is outputted by the multimode multiband power amplifier, transmitted to the TXM module via the duplexer, and transmitted by the TXM module. It should be understood that present disclosure is not limited to the exemplary examples. Those skilled in the art in the art may achieve equivalent improvements or replacements according to the above description. The equivalent improvements and replacements should be considered to belong to the protection scope of the present disclosure.

What is claimed is:

1. A mobile terminal for expanding a bandwidth of a B41 frequency band in LTE, comprising:
    a radio frequency transceiver configured to output an initial signal which requires being transmitted;
    a multimode multiband power amplifier configured to amplify a power of the initial signal and identify a type of the initial signal;
    a duplexer;
    a first surface acoustic wave (SAW) filter;
    a selection module; and
    a radio frequency transmission module,
    wherein when the multimode multiband power amplifier identifies that the initial signal is a signal in the B41 frequency band, the multimode multiband power amplifier determines a frequency band range of the signal in the B41 frequency band and outputs a transmitting signal in the B41 frequency band;
    the transmitting signal belonging to a first frequency band range in the B41 frequency band and outputted from the multimode multiband power amplifier is transmitted to the radio frequency transmission module via the duplexer and transmitted by the radio frequency transmission module;
    the transmitting signal belonging to a second frequency band range in the B41 frequency band and outputted from the multimode multiband power amplifier is transmitted to the radio frequency transmission module via the first SAW filter and transmitted by the radio frequency transmission module; and
    the transmitting signal belonging to a third frequency band range in the B41 frequency band and outputted from the multimode multiband power amplifier is switched to the duplexer by the selection module, transmitted to the radio frequency transmission module, and transmitted by the radio frequency transmission module;
    wherein the selection module is a single pole double throw switch, a connection terminal of the single pole double throw switch is connected to a first interface of the duplexer, a first transmission terminal of the single pole double throw switch is connected to a pin HB3 of the radio frequency transceiver, a second transmission terminal of the single pole double throw switch is connected to a thirty-ninth pin of the multimode multiband power amplifier, the first interface of the duplexer is configured to receive the transmitting signal in the third frequency band range in the B41 frequency band, and the thirty-ninth pin of the multimode multiband power amplifier is configured to output the transmitting signal in the third frequency band range in the B41 frequency band and receive a signal in the B41 frequency band.

2. The mobile terminal for expanding the bandwidth of the B41 frequency band in LTE of claim 1, wherein when the multimode multiband power amplifier identifies that the initial signal is a signal in a B7 frequency band, a transmitting signal in the B7 frequency band is outputted from the multimode multiband power amplifier, transmitted to the radio frequency transmission module via the duplexer, and transmitted by the radio frequency transmission module.

3. The mobile terminal for expanding the bandwidth of the B41 frequency band in LTE of claim 1, wherein when the radio frequency transmission module identifies that a received signal of the radio frequency transmission module is a signal in the B41 frequency band, the radio frequency transmission module determines a frequency band range of the received signal in the B41 frequency band and outputs the received signal in the B41 frequency band;
    the duplexer transmits the received signal in the B41 frequency band belonging to the first frequency band range to the multimode multiband power amplifier;
    the duplexer transmits the received signal in the B41 frequency band belonging to the third frequency band range to the selection module, and the selection module switches the received signal in the B41 frequency band belonging to the third frequency band range to the multimode multiband power amplifier;
    the received signal belonging to the second frequency band range is transmitted to the multimode multiband power amplifier after the first SAW filter filters the received signal belonging to the second frequency band range; and
    the multimode multiband power amplifier transmits the received signal in the B41 frequency band to the radio frequency transceiver.

4. The mobile terminal for expanding the bandwidth of the B41 frequency band in LTE of claim 3, wherein when the radio frequency transmission module identifies that the received signal is a signal in a B7 frequency band, the radio frequency transmission module outputs the received signal in the B7 frequency band;
    the duplexer further divides the received signal in the B7 frequency band into an uplink received signal in the B7 frequency band and a downlink received signal in the B7 frequency band and transmits the uplink received signal in the B7 frequency band to the multimode multiband power amplifier, and the selection module switches the downlink received signal in the B7 frequency band to the radio frequency transceiver; and
    the multimode multiband power amplifier further transmits the received signal in the B7 frequency band to the radio frequency transceiver.

5. The mobile terminal for expanding the bandwidth of the B41 frequency band in LTE of claim 1, wherein
    a second interface of the duplexer is connected to a thirty-fifth pin of the multimode multiband power amplifier, and a third interface of the duplexer is connected to a pin TRX2 of the radio frequency transmission module;
    one terminal of the first SAW filter is connected to a thirty-third pin of the multimode multiband power amplifier, and the other terminal of a second SAW filter is connected to a pin TRX3 of the radio frequency transmission module; and a forty-second pin of the multimode multiband power amplifier is connected to a pin HB1 of the radio frequency transceiver.

6. The mobile terminal for expanding the bandwidth of the B41 frequency band in LTE of claim 1, wherein the first SAW filter is a SAW filter used for the B41 frequency band and having a size of 1109, and a frequency band range of the SAW filter is 2555 MHz-2655 MHz.

7. The mobile terminal for expanding the bandwidth of the B41 frequency band in LTE of claim 1, wherein the first frequency band range is 2496 MHz-2570 MHz, the second frequency band range is 2555 MHz-2655 MHz, and the third frequency band range is 2620 MHz-2690 MHz.

8. The mobile terminal for expanding the bandwidth of the B41 frequency band in LTE of claim 1, further comprising a second SAW filter, wherein one terminal of the second SAW filter is connected to a thirty-seventh pin of the multimode multiband power amplifier, the other terminal of the second SAW filter is connected to a pin TRX1 of the radio frequency transmission module, and a forty-first pin of the multimode multiband power amplifier is connected to a pin HB2 of the radio frequency transceiver;

the multimode multiband power amplifier is further configured to output a transmitting signal in a B40 frequency band, the transmitting signal in the B40 frequency band is transmitted to the radio frequency transmission module after the second SAW filter filters the transmitting signal in the B40 frequency band; and the radio frequency transmission module is further configured to output, according to a frequency band of a received signal of the radio frequency transmission module, a received signal in the B40 frequency band, the received signal in the B40 frequency band is transmitted to the multimode multiband power amplifier after the second SAW filter filters the received signal in the B40 frequency band, and the received signal in the B40 frequency band is outputted from the forty-first pin of the multimode multiband power amplifier and inputted to the pin HB2 of the radio frequency transceiver.

9. A mobile terminal for expanding a bandwidth of a B41 frequency band in LTE, comprising:
a multimode multiband power amplifier configured to identify a type of an initial signal inputted to the multimode multiband power amplifier;
a duplexer;
a first surface acoustic wave (SAW) filter;
a selection module; and
a radio frequency transmission module,
wherein when the multimode multiband power amplifier identifies that the initial signal is a signal in the B41 frequency band, the multimode multiband power amplifier determines a frequency band range of the signal in the B41 frequency band and outputs a transmitting signal in the B41 frequency band;
the transmitting signal belonging to a first frequency band range in the B41 frequency band and outputted from the multimode multiband power amplifier is transmitted to the radio frequency transmission module via the duplexer;
the transmitting signal belonging to a second frequency band range in the B41 frequency band and outputted from the multimode multiband power amplifier is transmitted to the radio frequency transmission module via the first SAW filter and transmitted by the radio frequency transmission module; and the transmitting signal belonging to a third frequency band range in the B41 frequency band and outputted from the multimode multiband power amplifier is switched to the duplexer by the selection module and transmitted to the radio frequency transmission module;

wherein the selection module is a single pole double throw switch, a connection terminal of the single pole double throw switch is connected to a first interface of the duplexer, a first transmission terminal of the single pole double throw switch is connected to a pin HB3 of a radio frequency transceiver, a second transmission terminal of the single pole double throw switch is connected to a thirty-ninth pin of the multimode multiband power amplifier, the first interface of the duplexer is configured to receive the transmitting signal in the third frequency band range in the B41 frequency band, and the thirty-ninth pin of the multimode multiband power amplifier is configured to output the transmitting signal in the third frequency band range in the B41 frequency band and receive a signal in the B41 frequency band.

10. The mobile terminal for expanding the bandwidth of the B41 frequency band in LTE of claim 9, wherein when the multimode multiband power amplifier identifies that the initial signal is a signal in a B7 frequency band, a transmitting signal in the B7 frequency band is outputted from the multimode multiband power amplifier and transmitted to the radio frequency transmission module via the duplexer.

11. The mobile terminal for expanding the bandwidth of the B41 frequency band in LTE of claim 9, wherein when the radio frequency transmission module identifies that a received signal of the radio frequency transmission module is a signal in the B41 frequency band, the radio frequency transmission module determines a frequency band range of the received signal in the B41 frequency band and outputs the received signal in the B41 frequency band;

the duplexer transmits the received signal in the B41 frequency band belonging to the first frequency band range to the multimode multiband power amplifier, the duplexer transmits the received signal in the B41 frequency band belonging to the third frequency band range to the selection module, and the selection module switches the received signal in the B41 frequency band belonging to the third frequency band range to the multimode multiband power amplifier;

the received signal belonging to the second frequency band range is transmitted to the multimode multiband power amplifier after the first SAW filter filters the received signal belonging to the second frequency band range; and the multimode multiband power amplifier transmits the received signal in the B41 frequency band to the radio frequency transceiver of the mobile terminal.

12. The mobile terminal for expanding the bandwidth of the B41 frequency band in LTE of claim 11, wherein when the radio frequency transmission module identifies that the received signal is a signal in a B7 frequency band, the radio frequency transmission module outputs the received signal in the B7 frequency band;

the duplexer further divides the received signal in the B7 frequency band into an uplink received signal in the B7 frequency band and a downlink received signal in the B7 frequency band and transmits the uplink received signal in the B7 frequency band to the multimode multiband power amplifier, and the selection module switches the downlink received signal in the B7 frequency band to the radio frequency transceiver; and the multimode multiband power amplifier further transmits the received signal in the B7 frequency band to the radio frequency transceiver.

13. The mobile terminal for expanding the bandwidth of the B41 frequency band in LTE of claim 9, wherein a second interface of the duplexer is connected to a thirty-fifth pin of the multimode multiband power amplifier, and a third interface of the duplexer is connected to a pin TRX2 of the radio frequency transmission module;

one terminal of the first SAW filter is connected to a thirty-third pin of the multimode multiband power amplifier, and the other terminal of a second SAW filter is connected to a pin TRX3 of the radio frequency transmission module; and a forty-second pin of the multimode multiband power amplifier is connected to a pin HB1 of the radio frequency transceiver.

14. The mobile terminal for expanding the bandwidth of the B41 frequency band in LTE of claim 9, wherein the first SAW filter is a SAW filter used for the B41 frequency band and having a size of 1109, and a frequency band range of the SAW filter is 2555 MHz-2655 MHz.

15. The mobile terminal for expanding the bandwidth of the B41 frequency band in LTE of claim 9, wherein the first frequency band range is 2496 MHz-2570 MHz, the second frequency band range is 2555 MHz-2655 MHz, and the third frequency band range is 2620 MHz-2690 MHz.

16. The mobile terminal for expanding the bandwidth of the B41 frequency band in LTE of claim 9, further comprising a second SAW filter, wherein one terminal of the second SAW filter is connected to a thirty-seventh pin of the multimode multiband power amplifier, the other terminal of the second SAW filter is connected to a pin TRX1 of the radio frequency transmission module, and a forty-first pin of the multimode multiband power amplifier is connected to a pin HB2 of the radio frequency transceiver;

the multimode multiband power amplifier is further configured to output a transmitting signal in a B40 frequency band, the transmitting signal in the B40 frequency band is transmitted to the radio frequency transmission module after the second SAW filter filters the transmitting signal in the B40 frequency band; and the radio frequency transmission module is further configured to output, according to a frequency band of a received signal of the radio frequency transmission module, a received signal in the B40 frequency band, the received signal in the B40 frequency band is transmitted to the multimode multiband power amplifier after the second SAW filter filters the received signal in the B40 frequency band, and the received signal in the B40 frequency band is outputted from the forty-first pin of the multimode multiband power amplifier and inputted to the pin HB2 of the radio frequency transceiver.

17. A method for expanding a bandwidth of a B41 frequency band in LTE, comprising:

when a multimode multiband power amplifier identifies that an initial signal inputted to the multimode multiband power amplifier is a signal in the B41 frequency band, a frequency band range of the signal in the B41 frequency band is determined and a transmitting signal in the B41 frequency band is outputted;

transmitting the transmitting signal belonging to a first frequency band range in the B41 frequency band and outputted from the multimode multiband power amplifier to a radio frequency transmission module via a duplexer;

transmitting the transmitting signal belonging to a second frequency band range in the B41 frequency band and outputted from the multimode multiband power amplifier to the radio frequency transmission module via a first surface acoustic wave (SAW) filter; and switching, by a selection module, the transmitting signal belonging to a third frequency band range in the B41 frequency band and outputted from the multimode multiband power amplifier to the duplexer;

wherein the selection module is a single pole double throw switch, a connection terminal of the single pole double throw switch is connected to a first interface of the duplexer, a first transmission terminal of the single pole double throw switch is connected to a pin HB3 of a radio frequency transceiver, a second transmission terminal of the single pole double throw switch is connected to a thirty-ninth pin of the multimode multiband power amplifier, the first interface of the duplexer is configured to receive the transmitting signal in the third frequency band range in the B41 frequency band, and the thirty-ninth pin of the multimode multiband power amplifier is configured to output the transmitting signal in the third frequency band range in the B41 frequency band and receive a signal in the B41 frequency band.

18. The method for expanding the bandwidth of the B41 frequency band in LTE of claim 17, further comprising:

when the multimode multiband power amplifier identifies that the initial signal is a signal in a B7 frequency band, a transmitting signal in the B7 frequency band is outputted and transmitted to the radio frequency transmission module via the duplexer.

19. The method for expanding the bandwidth of the B41 frequency band in LTE of claim 17, further comprising:

when the radio frequency transmission module identifies that a received signal of the radio frequency transmission module is a signal in the B41 frequency band, the radio frequency transmission module determines a frequency band range of the received signal in the B41 frequency band and outputs the received signal in the B41 frequency band;

the duplexer transmits the received signal in the B41 frequency band belonging to the first frequency band range to the multimode multiband power amplifier, the duplexer transmits the received signal in the B41 frequency band belonging to the third frequency band range to the selection module, and the selection module switches the received signal in the B41 frequency band belonging to the third frequency band range to the multimode multiband power amplifier;

the received signal belonging to the second frequency band range is transmitted to the multimode multiband power amplifier after the first SAW filter filters the received signal belonging to the second frequency band range; and the multimode multiband power amplifier transmits the received signal in the B41 frequency band to the radio frequency transceiver.

20. The method for expanding the bandwidth of the B41 frequency band in LTE of claim 17, further comprising:

when the radio frequency transmission module identifies that the received signal is a signal in a B7 frequency band, the radio frequency transmission module outputs the received signal in the B7 frequency band;

the duplexer further divides the received signal in the B7 frequency band into an uplink received signal in the B7 frequency band and a downlink received signal in the B7 frequency band and transmits the uplink received signal in the B7 frequency band to the multimode multiband power amplifier, and the selection module switches the downlink received signal in the B7 frequency band to the radio frequency transceiver; and the multimode multiband power amplifier further transmits the received signal in the B7 frequency band to the radio frequency transceiver.

* * * * *

UNITED STATES PATENT AND TRADEMARK OFFICE
CERTIFICATE OF CORRECTION

| | |
|---|---|
| PATENT NO. | : 11,444,642 B2 |
| APPLICATION NO. | : 16/617003 |
| DATED | : September 13, 2022 |
| INVENTOR(S) | : Wen Wang |

It is certified that error appears in the above-identified patent and that said Letters Patent is hereby corrected as shown below:

On the Title Page

In item (73) Assignee:
"TCL Communication (Ningbo) Co., Ltd."
Should be changed to:
-- TCL Communications (Ningbo) Co., Ltd. --

Signed and Sealed this
Third Day of October, 2023

*Katherine Kelly Vidal*

Katherine Kelly Vidal
*Director of the United States Patent and Trademark Office*